United States Patent
Lin et al.

(10) Patent No.: US 8,875,065 B1
(45) Date of Patent: Oct. 28, 2014

(54) TRIPLE-PATTERN LITHOGRAPHY LAYOUT DECOMPOSITION VALIDATION

(71) Applicant: Taiwan Semiconductor Manufacturing Co., Ltd., Hsin-Chu (TW)

(72) Inventors: Hung Lung Lin, Hsinchu (TW); Chin-Chang Hsu, Banqiao (TW); Min-Yuan Tsai, Zhubei (TW); Wen-Ju Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/953,767

(22) Filed: Jul. 30, 2013

Related U.S. Application Data

(60) Provisional application No. 61/835,267, filed on Jun. 14, 2013.

(51) Int. Cl.
  *G06F 17/50* (2006.01)

(52) U.S. Cl.
  CPC .................................. *G06F 17/5081* (2013.01)
  USPC ........................................................... 716/52

(58) Field of Classification Search
  USPC ............................................................. 716/52
  See application file for complete search history.

(56) References Cited

U.S. PATENT DOCUMENTS

| | | | |
|---|---|---|---|
| 8,484,607 B1 * | 7/2013 | Tang et al. | 716/136 |
| 2011/0078638 A1 * | 3/2011 | Kahng et al. | 716/52 |
| 2012/0216157 A1 * | 8/2012 | Luo et al. | 716/55 |
| 2013/0074024 A1 * | 3/2013 | Chase et al. | 716/112 |

* cited by examiner

*Primary Examiner* — Vuthe Siek
*Assistant Examiner* — Mohammed Alam
(74) *Attorney, Agent, or Firm* — Duane Morris LLP

(57) ABSTRACT

A method of decomposing a layout for triple pattern lithography generates a first conflict graph from the layout. The method generates a second conflict graph from the first conflict graph, and identifies loops in the second conflict graph as decomposition violations.

20 Claims, 9 Drawing Sheets

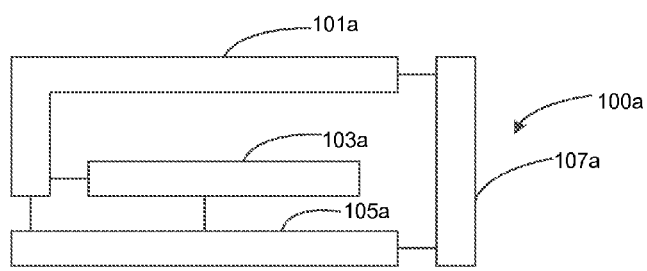
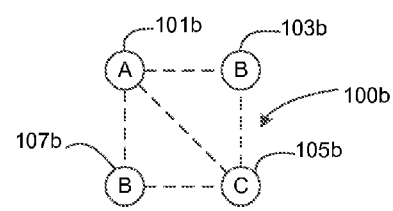
FIG. 1A
FIG. 1B
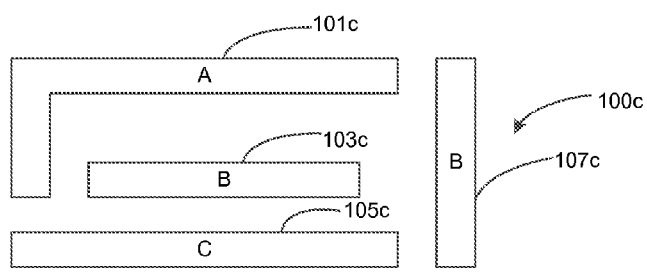
FIG. 1C
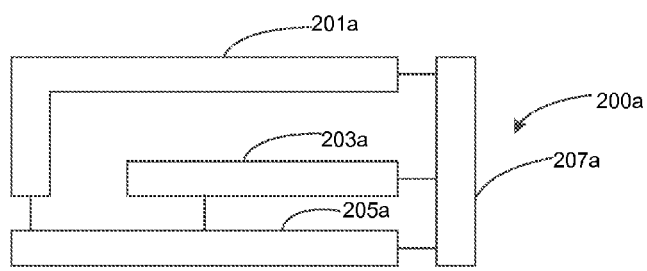
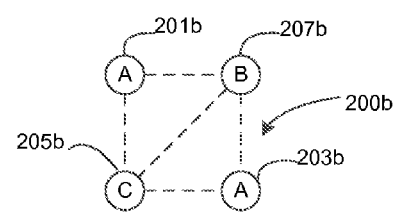
FIG. 2A
FIG. 2B
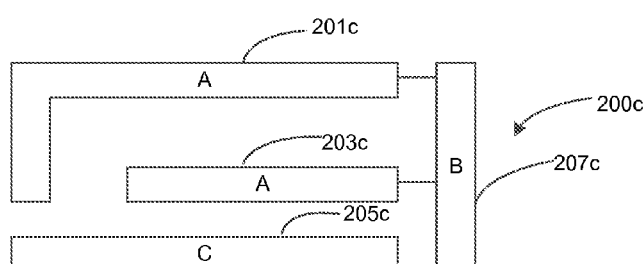
FIG. 2C

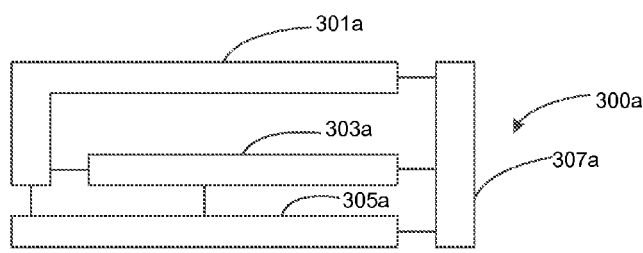
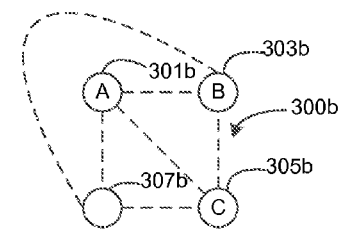
FIG. 3A  FIG. 3B
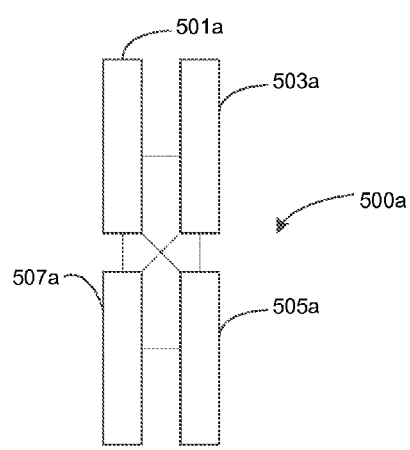
FIG. 5A
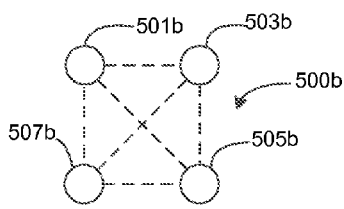
FIG. 5B
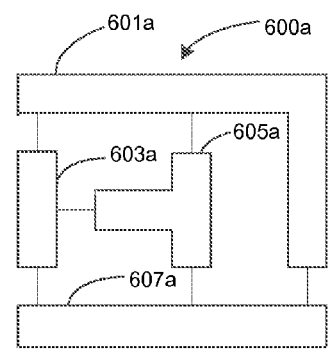
FIG. 6A
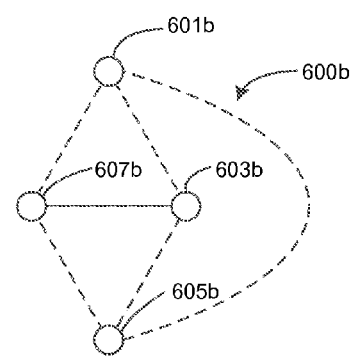
FIG. 6B

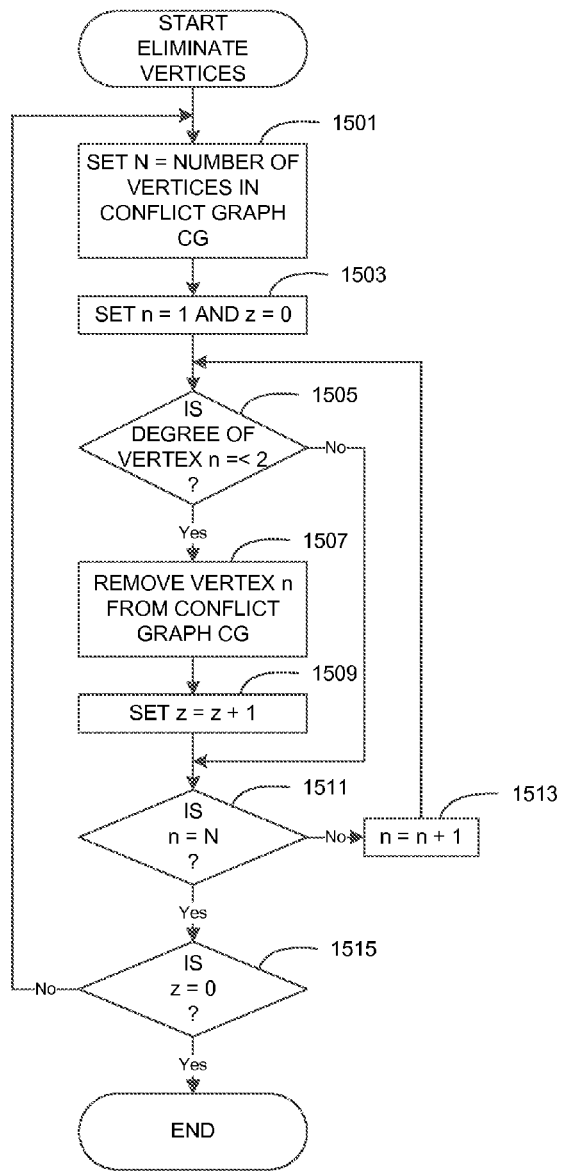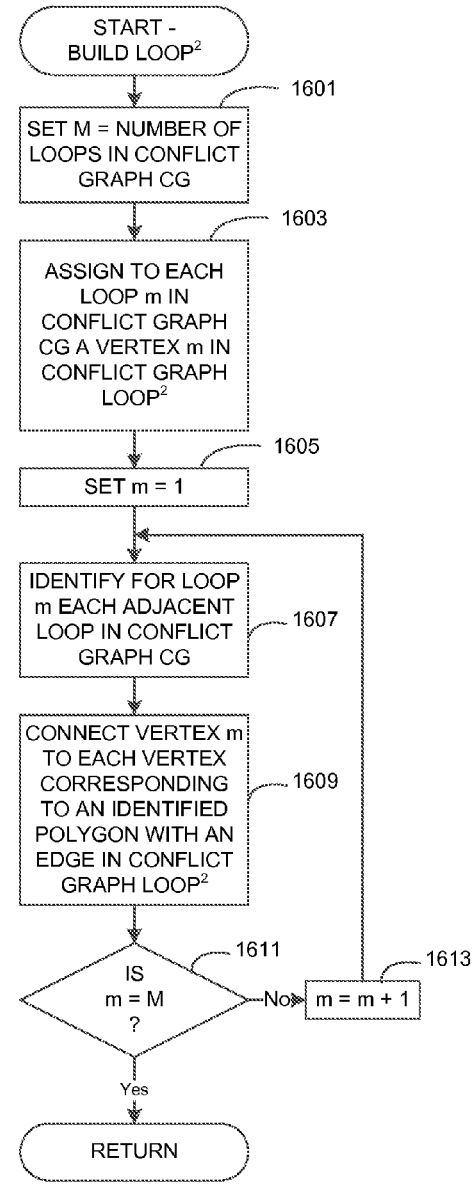
FIG. 15
FIG. 16

TRIPLE-PATTERN LITHOGRAPHY LAYOUT DECOMPOSITION VALIDATION

CROSS-REFERENCE TO RELATED APPLICATIONS

This application claims the benefit of U.S. Provisional Application Ser. No. 61/835,267, filed Jun. 14, 2013, which is expressly incorporated herein by reference in its entirety.

BACKGROUND

This disclosure relates generally to the field of manufacture semiconductor integrated circuits using triple-pattern lithography, and more particularly to methods, systems, and computer program products validating triple-pattern lithography layout decomposition.

In semiconductor fabrication processes, the resolution of a photoresist pattern begins to blur at about 45 nanometers (nm) half pitch. In order to provide semiconductor layers with smaller distances between adjacent patterns, with resorting to such expedients as extreme ultra violet (EUV) technology, double-patterning has been developed. In double-patterning, the layout of a single layer of an integrated circuit (IC) is decomposed into two masks. Then, there are two separate exposure and etching steps using each of the two masks separately. The advantages achieved with double-patterning have been extending using triple-patterning, wherein the layout is decomposed into three separate masks.

In multiple-patterning, such as double- and triple-patterning, design rules provide that polygons of the layout (of the same layer) that are separated from each other by less than a predetermined distance not be in the same mask. Graph theory has been applied to the analysis and validation of multiple-pattern decompositions. A given layout can be represented as a conflict graph CG=(V, G), wherein each vertex V represents a polygon (i.e., a circuit pattern) of the layout and an edge E is formed connecting two vertices, when the distance between two corresponding polygons is less than a minimum separation distance for clearly exposed patterns using a single photomask. A closed loop in a conflict graph with an even number of vertices can always be decomposed into two masks. Accordingly, a decomposition violation in double-patterning can be detected by the presence of a loop with an odd number of vertices in the conflict graph. However, decomposition validation in triple-patterning is a much more complex problem. In fact, the problem is NP-complete, which makes the problem not solvable in a reasonable amount of time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

FIG. 1A is a top view of a layout in accordance with various embodiments of the present disclosure.

FIG. 1B is a conflict graph of the layout of FIG. 1A in accordance with various embodiments of the present disclosure.

FIG. 1C is a triple-patterning decomposition of the layout of FIG. 1A in accordance with various embodiments of the present disclosure.

FIG. 2A is a top view of a second layout in accordance with various embodiments of the present disclosure.

FIG. 2B is a conflict graph of the layout of FIG. 2A in accordance with various embodiments of the present disclosure.

FIG. 2C is a triple-patterning decomposition of the layout of FIG. 2A in accordance with various embodiments of the present disclosure.

FIG. 3A is a top view of a third layout in accordance with various embodiments of the present disclosure.

FIG. 3B is a conflict graph of the layout of FIG. 3A in accordance with various embodiments of the present disclosure.

FIGS. 5A and 5B are a top view of a layout and its conflict graph, respectively, illustrating a cross-link violation according to various embodiments of the present disclosure.

FIGS. 6A and 6B are a top view of a layout and its conflict graph, respectively, without a cross-link violation according to various embodiments of the present disclosure.

FIG. 15 is a flowchart of eliminating conflict graph vertices of degree equal to or less than two processing according to various embodiments of the present disclosure.

FIG. 16 is a flowchart of building a second (Loop$^2$) conflict graph from a first conflict graph processing according to various embodiments of the present disclosure.

DETAILED DESCRIPTION

Figure 4:
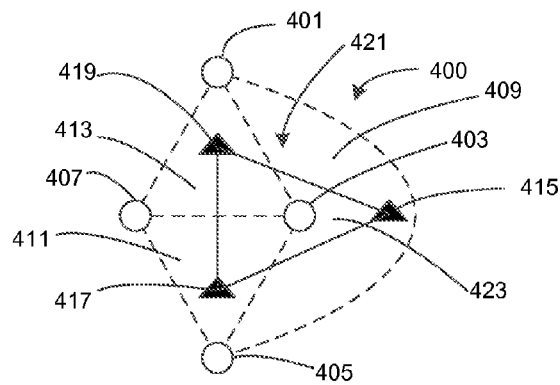
FIG. 4 illustrates a first conflict graph of a layout and a second conflict graph of the first conflict graph in accordance with various embodiments of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning coupling and the like, such as "connected" and "interconnected," refer to a relationship wherein devices or nodes are in direct or indirect electrical communication, unless expressly described otherwise.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Referring now to the drawings, and first to FIG. 1A, a layout for a layer of an integrated circuit is designated generally by the numeral 100a. Layout 100a includes polygons 101a, 103a, 105a and 107a representing circuit patterns. As indicated by lines interconnecting various polygons 101a-107a, certain polygons are spaced apart from other polygons of layout 100a by less than a predetermined distance (the minimum separation distance between patterns that can be clearly formed using a single photomask). Thus, polygon 101a is spaced less than the predetermined distance from polygons 103a, 105a and 107a; polygon 103a is space less than the predetermined distance from polygons 101a and 105a; polygon 105a is spaced less than the predetermined distance from polygons 101a, 103a and 107a; and polygon 107a is spaced less than the predetermined distance from polygons 101a and 105a. It will be understood that the interconnecting lines of FIG. 1A indicate only spacing and are not structural features of layout 100a.

According to some embodiments of the present disclosure, layout 100a can be represented by a conflict graph 100b, as shown in FIG. 1B. Conflict graph 100b comprises a set of vertices 101b, 103b, 105b, and 107b, which correspond to polygons 101a, 103a, 105a and 107a, respectively, of layout 100a, and edges, indicated by dashed lines in FIG. 1B, which correspond to the spacing of polygons 101a-107a of layout 100a.

Conflict graphs can be used in decomposing layouts into separate masks for triple-pattern lithography, or in verifying that a set of masks is properly decomposed, such that no two polygons in the same mask are spaced apart by less than the predetermined distance. A decomposition violation occurs when two vertices connected by a common edge are assigned to the same mask. Herein, assigning a polygon to a mask refers to associating a circuit pattern with a photomask, so that material in the shape of that circuit pattern is to be deposited on that photomask during the mask fabrication process.

In some embodiments of the present disclosure, the three masks are designated A, B and C. As shown in FIG. 1B, vertex 101b is assigned to mask A, vertex 103b is assigned to mask B, and vertex 105b is assigned to mask C. Since vertex 107b shares edges with vertices 101b and 105b, vertex 107b must be assigned to mask B. Since no vertices in conflict graph 100b share edges with a vertex assigned to the same mask, layout 100 may be validly decomposed in accordance with conflict graph 100b. The decomposition is shown in FIG. 1C, wherein polygon 101c is assigned to mask A, polygons 103c and 107c are assigned to mask B, and polygon 105c is assigned to mask C.

Referring now to 2A, a layout for a layer of a second integrated circuit is designated generally by the numeral 200a. Layout 200a includes polygons 201a, 203a, 205a and 207a. Polygon 201a is spaced less than the predetermined distance from polygons 205a and 207a; polygon 203a is space less than the predetermined distance from polygons 205a and 207a; polygon 205a is spaced less than the predetermined distance from polygons 201a, 203a and 207a; and polygon 207a is spaced less than the predetermined distance from polygons 201a, 203a and 205a.

As shown in FIG. 2B, layout 200a is represented by a conflict graph 200b. Conflict graph 200b comprises a set of vertices 201b, 203b, 205b, and 207b, which correspond to polygons 201a, 203a, 205a and 207a, respectively, of layout 200a, and edges, indicated by dashed lines in FIG. 2B, which correspond to the spacing of polygons 201a-207a of layout 200a.

As shown in FIG. 2B, vertex 201b is assigned to mask A, vertex 207b is assigned to mask B, and vertex 205b is assigned to mask C. Since vertex 203b shares edges with vertices 205b and 207b, vertex 203b is assigned to mask A. Since no vertices in conflict graph 200b share edges with a vertex assigned to the same mask, layout 200 may be validly decomposed in accordance with conflict graph 200b. The decomposition is shown in FIG. 1C, wherein polygons 201c and 203c are assigned to mask A, polygon 207c is assigned to mask B, and polygon 205c is assigned to mask C.

Referring now to 3A, a layout for a layer of a third integrated circuit is designated generally by the numeral 300a. Layout 300a includes polygons 301a, 303a, 305a and 307a. Polygon 301a is spaced less than the predetermined distance from polygons 305a and 307a; polygon 303a is space less than the predetermined distance from polygons 301a, 305a and 307a; polygon 305a is spaced less than the predetermined distance from polygons 301a, 303a and 307a; and polygon 307a is spaced less than the predetermined distance from polygons 301a, 303a and 305a.

As shown in FIG. 3B, layout 300a is represented by a conflict graph 300b. Conflict graph 300b comprises a set of vertices 301b, 303b, 305b, and 307b, which correspond to polygons 301a, 303a, 305a and 307a, respectively, of layout 300a, and edges, indicated by dashed lines in FIG. 3B, which correspond to the spacing of polygons 301a-307a of layout 300a.

As shown in FIG. 3B, if vertex 301b is assigned to mask A, vertex 303b is assigned to mask B, and vertex 305b is assigned to mask C, then vertex 307b cannot be assigned to any masks A, B, or C without resulting in a decomposition violation. Since each of the four vertices 301b-307b is connected by an edge to every other vertex in conflict graph 300b, layout 300a cannot be validly decomposed into three masks. Accordingly, layout 300a must be redesigned before it can be validly decomposed.

Referring now to FIG. 4, a conflict graph is designated generally by the numeral 400. Conflict graph 400 includes vertices 401, 403, 405 and 407, connected by edges, indicated by dashed lines. As described with reference to FIGS. 3A and 3B, a layout corresponding to conflict graph 400 cannot be validly decomposed for triple-pattern lithography without conflicts.

Conflict graphs according to some embodiments of the present disclosure include loops. As used herein, a loop is an alternating sequence of vertices and edges that begin and end on the same vertex, with no repeated edge or vertex. Also, as used herein, a loop is "clear" or "open" in that it does not encompass any other edge or vertex of the conflict graph.

Thus, conflict graph 400 includes a first loop 409, a second loop 411 and a third loop 413.

According to some embodiments of the present disclosure, each loop in a layout or first conflict graph is represented by one vertex in a second conflict graph, sometimes referred to below as a "Loop$^2$" conflict graph. Referring to FIG. 4, loop 409 is represented by a vertex 415, loop 411 is represented by a vertex 417, and loop 413 is represented by a vertex 419, of a Loop$^2$ conflict graph 421. Loop$^2$ vertices 415 and 417, which represent adjacent first conflict graph loops 409 and 411, respectively, are connected by an edge, indicated by a solid line. As used herein, first conflict graph loops are "adjacent" if they share a common first conflict graph edge. Loop$^2$ vertices 417 and 419, which represent adjacent first conflict graph loops 411 and 413, respectively, are connected by an edge. Finally, Loop$^2$ vertices 419 and 415, which represent adjacent first conflict graph loops 413 and 409, respectively, are connected by an edge.

Loop$^2$ vertices 415, 417, and 419, and their respective edges form a loop. According to some embodiments of the present disclosure, every triple-pattern lithograph decomposition violation in a layout is identified by a loop in a loop$^2$ conflict graph. Thus, loop$^2$ loop 423 in Loop$^2$ conflict graph 421 indicates that the layout represented by first conflict graph 400 is not decomposable.

The concept of open or clear loops is illustrated in FIGS. 5A-5B and 6A-6B. FIG. 5A depicts a layout 500a, which includes polygons 501a, 503a, 505a and 507a. As indicated by the lines connecting the polygons, polygon 501a is spaced less than the predetermined distance apart from polygons 503a, 505a and 507a; polygon 503a is spaced less than the predetermined distance apart from polygons 501a, 505a and 507a; polygon 505a is spaced less than the predetermined distance apart from polygons 501a, 503a and 507a; and polygon 507a is spaced less than the predetermined distance apart from polygons 501a, 503a and 505a. FIG. 5B depicts a conflict graph 500b representing layout 500a. In conflict graph 500b, the edge connecting vertices 501b and 505b crosses the edge connecting vertices 503b and 507b. According to design rules in some embodiments of the present disclosure, the crossing edges makes conflict graph 500b improper. Conflict graph 500b can be corrected by routing the edge connecting vertices 501b and 505b outside vertex 503b, for example.

FIG. 6A depicts a layout 600a, which includes polygons 601a, 603a, 605a and 607a. As indicated by the lines connecting the polygons, polygon 601a is spaced less than the predetermined distance apart from polygons 603a, 605a and 607a; polygon 603a is spaced less than the predetermined distance apart from polygons 601a, 605a and 607a; polygon 605a is spaced less than the predetermined distance apart from polygons 601a, 603a and 607a; and polygon 607a is spaced less than the predetermined distance apart from polygons 601a, 603a and 605a. FIG. 6B depicts a conflict graph 600b representing layout 600a. In conflict graph 600b, there are no crossing edges. Accordingly, conflict graph 600b is proper.

Figure 7:
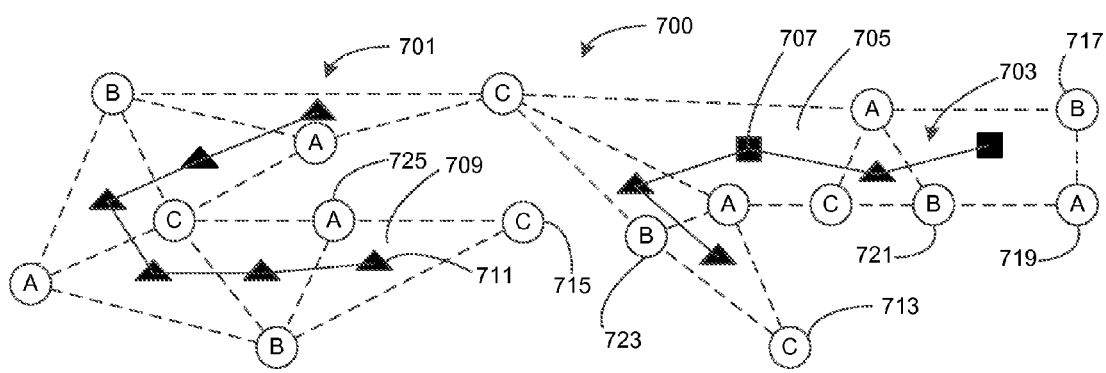
FIG. 7 illustrates an example of a first conflict graph and its second conflict graph, wherein the second conflict graph has no loops, according to some embodiments of the present disclosure.

FIG. 7 illustrates a first conflict graph 700 representing a particular layout and second, Loop$^2$, conflict graphs 701 and 703. It will be noted that since there are no loops in Loop$^2$ conflict graphs 701 or 703, there are no triple-patterning violations in the layout represented by first conflict graph 700.

According to some embodiments of the present disclosure, Loop$^2$ vertices representing loops in first conflict graph 700 with even numbers of vertices are represented by squares, and Loop$^2$ vertices representing loops in first conflict graph 700 with odd numbers of vertices are represented by triangles. For example, even loop 705 of first conflict graph 700 is represented by square vertex 707 of Loop$^2$ conflict graph 703, while odd loop 709 of first conflict graph 700 is represented by triangle vertex 711 of Loop$^2$ conflict graph 701.

While every layout that is not decomposable for triple-patterning is identified by a loop in a loop$^2$ conflict graph, not every loop in a loop$^2$ conflict graph identifies a decomposition violation in the layout. For example, referring to FIG. 8, which illustrates a first conflict graph 800, which represents a particular layout, and an a Loop$^2$ conflict graph 801. It will be noted that every loop in first conflict graph 800 comprises an even number of vertices. Although Loop$^2$ conflict graph comprises two loops, the layout represented by first conflict graph 800 can be decomposed into two masks, A and B. Every layout that can be represented by a first conflict graph that includes only loops defined by even numbers of vertices can be decomposed into two masks without requiring a third mask.

Figure 9:
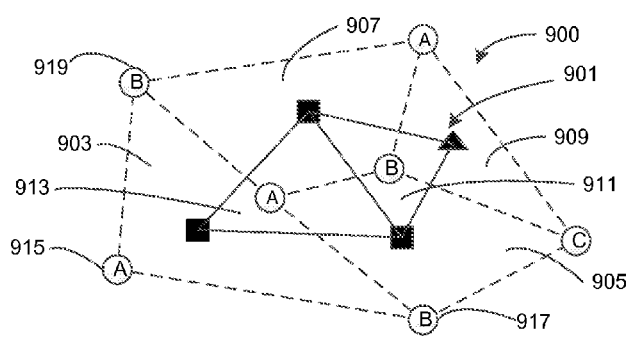
FIG. 9 illustrates a second example of a first conflict graph and its second conflict graph, wherein the second conflict graph has loops but there are no triple-patterning violations, according to some embodiments of the present disclosure.

FIG. 9 illustrates a first conflict graph 900, representing a particular layout, and its corresponding Loop$^2$ conflict graph 901. It will be noted that first conflict graph 900 includes three even loops 903, 905 and 907, and one odd loop 909. Although Loop$^2$ conflict graph includes two loops 911 and 913, the layout represented by conflict graph 900 can be decomposed into three masks, A, B and C. Every layout that can be represented by a first conflict graph that includes only one loop defined by an odd numbers of vertices can be decomposed into three masks. Thus, in some embodiment of the present disclosure, the solution set defined by Loop$^2$ loops can be reduced by waiving or eliminating apparent Loop$^2$ violations that identify layouts or portions of layouts represented by first conflict graphs having loops including only zero or one odd number loop, with all the remaining loops being even numbered. The foregoing waiver properties are merely illustrative and not limiting in that other waiver properties can be identified.

The solution set defined by Loop$^2$ loops can also be reduced by iteratively eliminating from the first conflict graph (generated from the layout) all vertices having a degree equal to or less than two because these vertices can be assigned to masks passively, without inducing any triple-patterning conflict. As used herein, the degree of a vertex is defined by the number of edges to which it is attached. Thus, a vertex with no edges has a degree of zero, a vertex with one edge has degree of one, and so on. For example, referring again to FIG. 7, vertices 715-719 of conflict graph 700 are each of degree two, while the remainder of the vertices of conflict graph 700 are of degree greater than two. Accordingly, vertices 715-719, and their connected edges, can be eliminated from conflict graph 700. After removal of those vertices and edges, it will be noted the degree of vertices 721-725 is reduced to two. Accordingly, vertices 721-725, and their connected edges, can be eliminated from conflict graph 700. The process of removing vertices of degree equal to or less than two can be iteratively repeated until there remain only vertices of degree or more in conflict graph 700. It can be demonstrated that conflict graph 700 can be eliminated completely by iteratively eliminating vertices of degree equal to or less than two, thereby eliminating the need for loop$^2$ conflict graphs 701 and 703 in the solution set.

Figure 8:
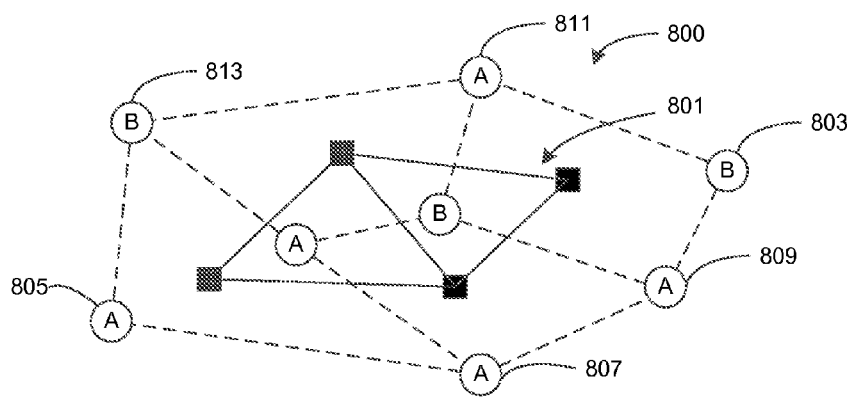
FIG. 8 illustrates an example of a first conflict graph and its second conflict graph, wherein the second conflict graph has loops but there are no triple-patterning violations, according to some embodiments of the present disclosure.

Conflict graph 800 of FIG. 8 includes vertices 803 and 805 having a degree of two, with all the other vertices having degree greater than two. By removing vertices 803 and 805, and their connected edges, from conflict graph 800 vertices 807-813 become of degree two, thereby allowing those vertices and their connected edges to be eliminated. After elimination of vertices 807-813, the remaining vertices of conflict graph 800 are of degree two or less. Accordingly, all of the conflicts in conflict graph 800 can be eliminated, thereby eliminating the need for loop² conflict graph 801 in the solution set.

Referring to FIG. 9, conflict graph 900 includes a single degree two vertex 915. Elimination of vertex 915, and its connected edges, results in vertices 917 and 919 becoming degree two vertices. After elimination of vertices 917 and 919, the remaining vertices of conflict graph 900 are of degree two or less. Accordingly, conflict graph 900 can be eliminated, thereby eliminating the need for loop² conflict graph 901 in the solution set.

Figure 10A:
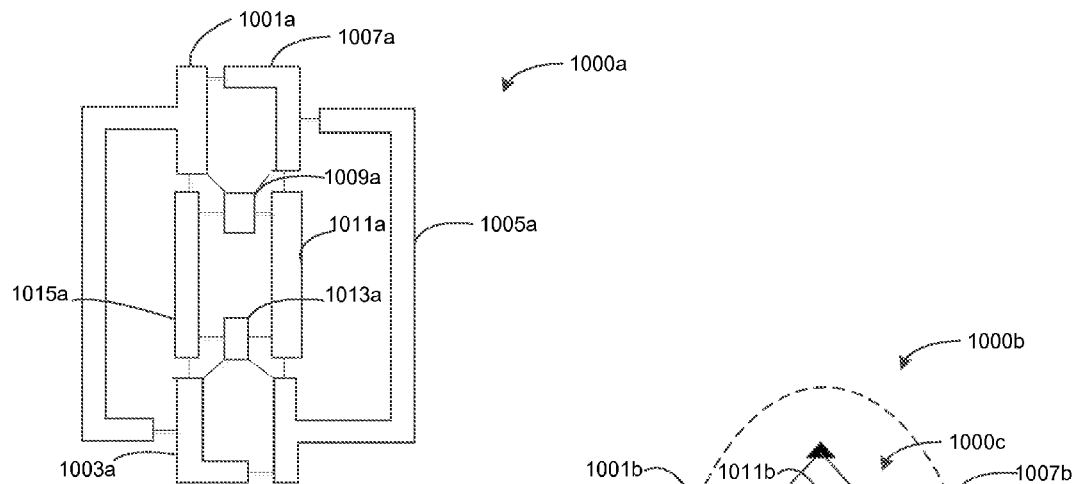
FIGS. 10A and 10B are a top view of a layout and its conflict graph, respectively, illustrating a Loop violation according to various embodiments of the present disclosure.
Figure 10B:
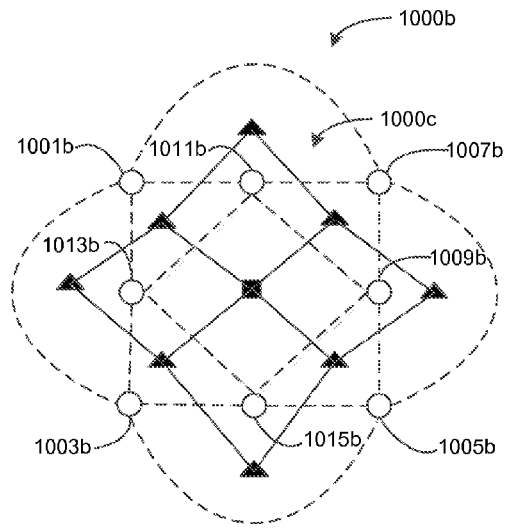

FIG. 10A illustrates a layout 1000a, which includes polygons 1001a-1015a. FIG. 10B illustrates a first conflict graph 1000b, generated from layout 1000a, and a Loop² conflict graph 1000c, generated from first conflict graph 1000b. First conflict graph 1000b includes eight odd loops and one even loop. Since all vertices 1001b-1015b of first conflict graph 1000b are of degree four, no vertices and their associated edges can be eliminated from conflict graph 1000b. Accordingly, Loop² loop 1000c identifies layout 1000a as being non-decomposable for triple-pattern lithography.

Figure 11:
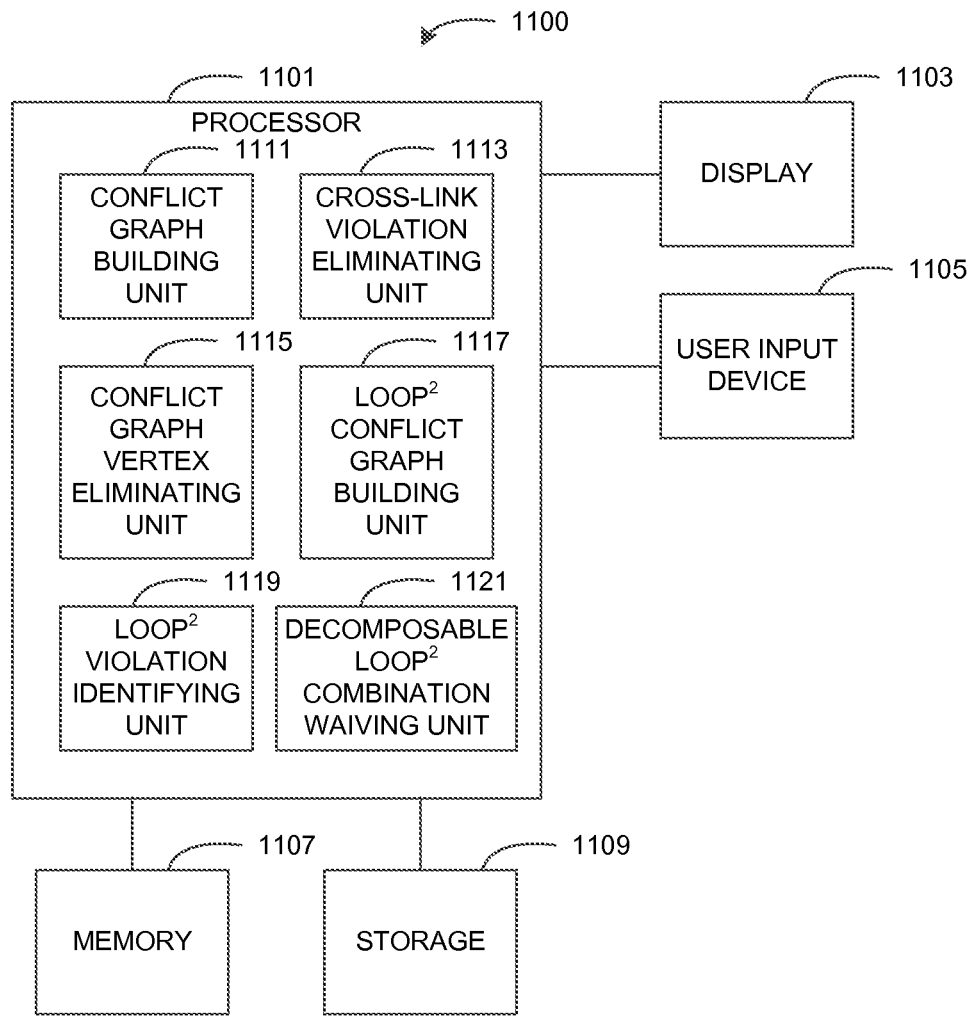
FIG. 11 is a block diagram of a system according to various embodiments of the present disclosure.

Referring now to FIG. 11, a system according to some embodiments of the present disclosure is designated generally by the numeral 1100. System 1100 can be implemented in a computer, such as a personal computer, workstation, or the like. System 1100 includes a processor 1101, a display 1103, a user input devices 1105, such as a mouse and a keyboard, memory 1107, and storage 1109. Memory 1107 can be working memory, such as random access memory (RAM), and it is adapted to store program and operating system instructions, and data used by processor 1101, as will be described in detail hereinafter. Storage 1109 can be a hard disc or the like, and it is adapted to store programs and data, such as layout files.

Processor 1101 is adapted to execute program instructions according to some embodiments of the present disclosure. When executing program instructions, processor 1101 provides a conflict graph building unit 1111, a Loop² conflict building unit 1117, and a Loop² violation identification unit 1119, the functions of which will described in detail hereinafter. Processor 1101 can also provide a cross-link violation eliminating unit 1113, a conflict graph vertex eliminating unit, 1115, and a decomposable loop combination waiving unit 1121, the functions of which will described in detail hereinafter.

Figure 12:
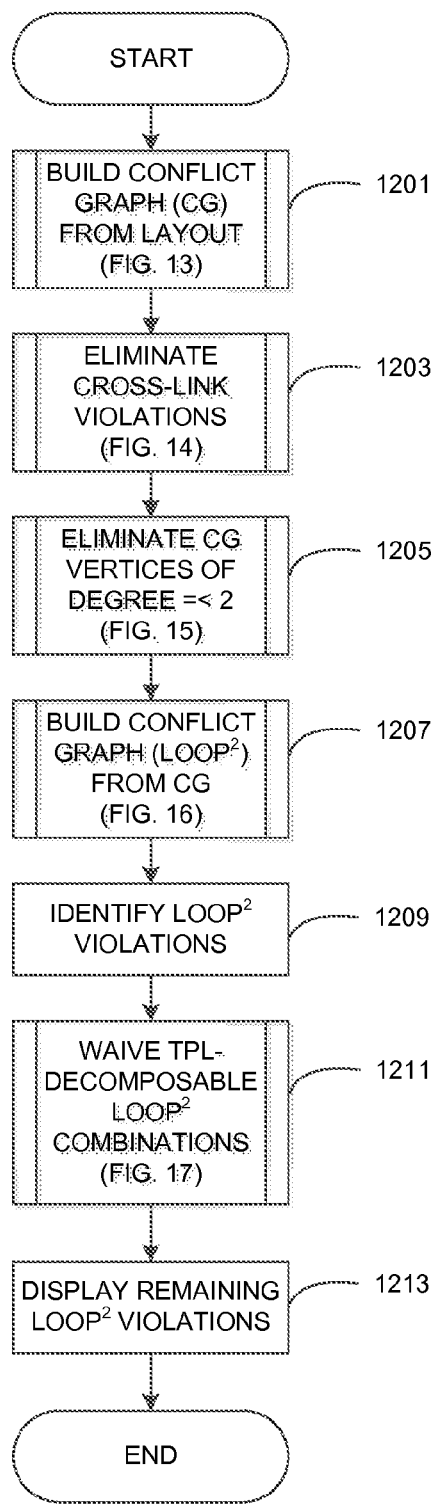
FIG. 12 is a flowchart of processing according to various embodiments of the present disclosure.
Figures 13, 14:
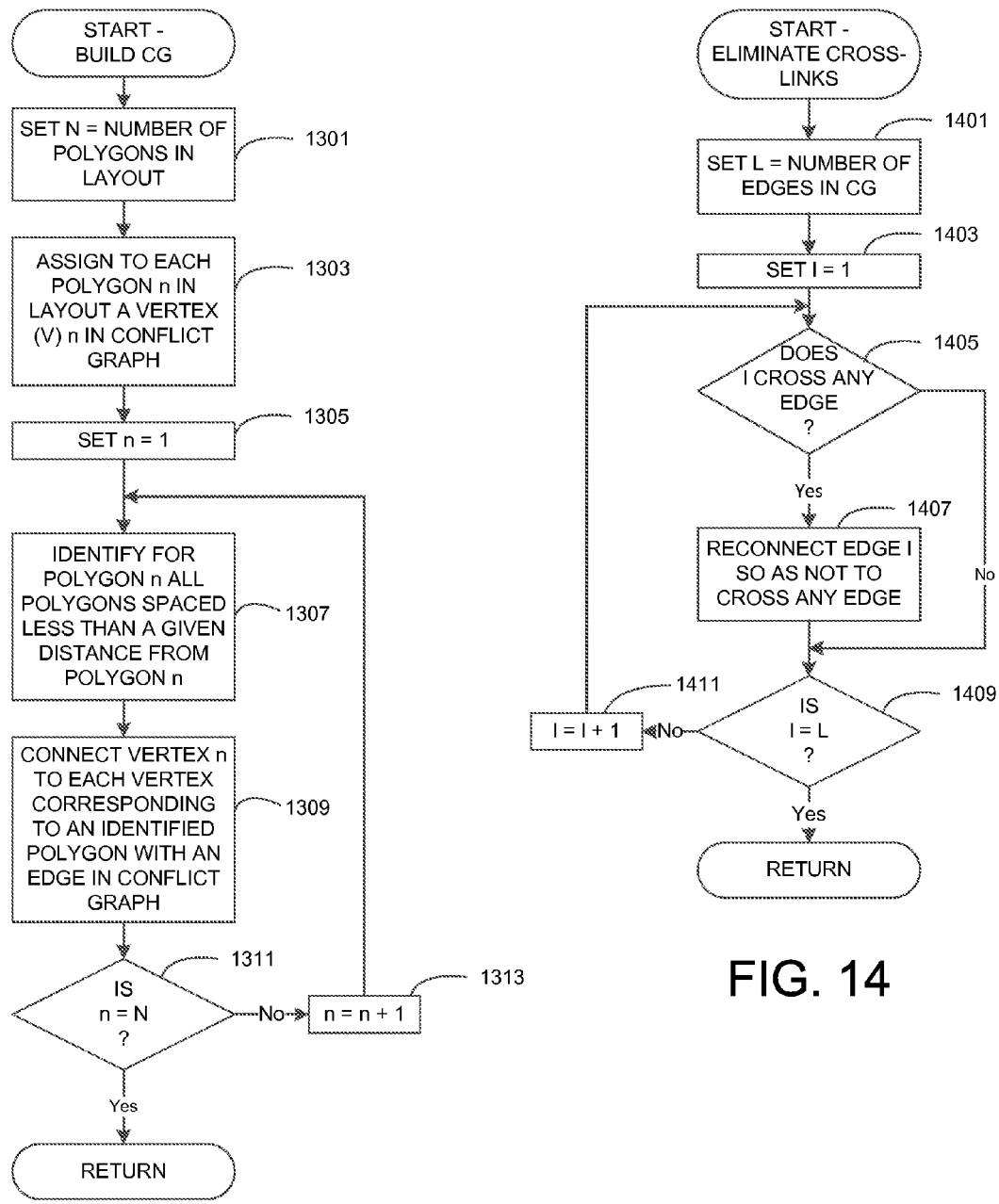
FIG. 13 is a flowchart of building a conflict graph from a layout processing according to various embodiments of the present disclosure.
FIG. 14 is a flowchart of eliminating cross-link violation processing according to various embodiments of the present disclosure.

FIG. 12 is a high-level flowchart of processing according to some embodiments of the present disclosure. The system builds a conflict graph from the layout, as indicated generally at block 1201 and as described in detail with reference to FIG. 13. Referring to FIG. 13, in an embodiment of a conflict graph building process, the system sets a constant N equal to the number of polygons in the layout, at block 1301. Then, the system assigns each polygon n in the layout a vertex in the conflict graph, at block 1303, and sets a constant n equal to 1, at block 1305. The system then identifies for polygon n all polygons in the layout spaced less than a predetermined distance from polygon n, as indicated at block 1307. After having identified all the polygons in the layout spaced less than the predetermined distance from polygon n, the system connects vertex n to each vertex corresponding to an identified polygon in the layout with an edge in the conflict graph, at block 1309, and determines, at decision block 1311, if n is equal to N. If n is not equal to N, the system increments constant n, at block 1313, an processing returns to block 1307. If n is equal to N, processing returns to FIG. 12. Thus, processing according to FIG. 13 continues until the conflict graph is completed.

Returning to FIG. 12, after building the conflict graph, as indicated at block 1201, the system eliminates cross-link violations, as indicated generally at block 1203, and described in detail with reference to FIG. 14. Referring to FIG. 14, in an embodiment of a cross-link elimination processing, the system set a constant L equal to the number of edges in the conflict graph, at block 1401, and sets a constant l equal to 1, at block 1403. Then, the system determines, at decision block 1405, if edge l crosses any other edge. If edge l is determined to cross any other edge in the conflict graph, the system reconnects edge l so as not to cross any edge, as indicated at block 1407. Then, the system determines, at decision block 1409, if l is equal to L. If l is not equal to L, the system increments l, at block 1411, and processing returns to decision block 1405. Thus, processing according to FIG. 14 continues until all edges of the conflict graph have been checked to crossing links, at which point processing returns to FIG. 12.

Returning to FIG. 12, after completing cross-link violation elimination processing according to block 1203, the system eliminates conflict graph vertices having a degree of equal to or less than two, as indicated generally at block 1205, and shown in detail in FIG. 15. Referring to FIG. 15, in an embodiment of vertex elimination processing, the system sets a constant N equal to the number of vertices in the conflict graph, at block 1501, and sets a constant n equal to one and a constant z equal to zero, at block 1503. Then, the system determines, at decision block 1505, if the degree of vertex n is equal to or less than two. If the degree of vertex n of the conflict graph is less than or equal to two, the system removes vertex n from the conflict graph, at block 1507, and increments constant z, at block 1509. Then the system determines, at decision block 1511, if n is equal to N. If n is not equal to N, the system increments n, at block 1513, and processing returns to decision block 1505. If n is determined to be equal to N, then the system determines if z is equal to zero, at decision block 1515. If z is determined not to be equal to zero, which indicates that at least one vertex has been removed from the conflict graph, processing returns to block 1501, where N is set to the new number of vertices in the conflict graph. Then, processing according to FIG. 15 is executed again. Thus, processing according to FIG. 15 continues iteratively until all vertices of the conflict graph have been eliminated and only vertices of degree greater than two remain in the conflict graph, at which time processing returns to FIG. 12. Processing according to FIG. 15 may reduce substantially the size of the solution set of triple-pattern decomposition violations yielded according to some embodiments of the present disclosure.

Returning to FIG. 12, after completing processing at block 1205, the system builds the Loop² conflict graph, as indicated generally at block 1207, and as described in detail with reference to FIG. 16. Referring to FIG. 16, in an embodiment of Loop² conflict graph build processing, the system sets a constant M equal to the number of loops in the conflict graph, at block 1601, and assigns each loop m in the conflict graph to a vertex m in the Loop² conflict graph, at block 1603. Then the system sets m equal to 1, at block 1605, and identifies for loop m each adjacent loop in the conflict graph, at block 1607. After having identified all adjacent loops, the system connects vertex m to each vertex corresponding to an adjacent loop with an edge of the Loop² conflict graph, at block 1609, and determines, at decision block 1611, if m is equal M. If m is not equal to M, the system increments m, at block 1613, and processing returns to block 1607. Processing according to FIG. 16 continues until all vertices in the Loop² conflict graph have been connected with edges to all vertices corresponding to adjacent loops of the conflict graph, at which time processing returns to FIG. 12.

Figure 17:
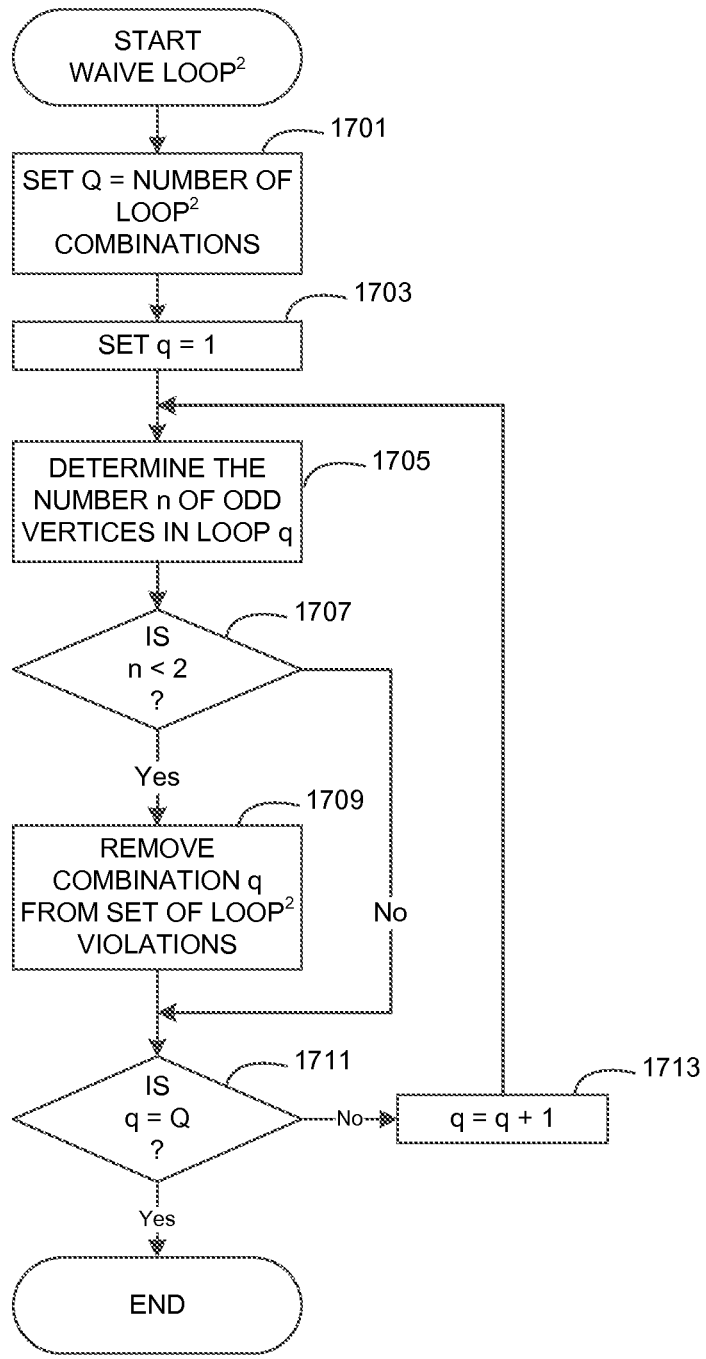
FIG. 17 is a flowchart of waiving triple-patterning decomposable Loop$^2$ combination processing according to various embodiments of the present disclosure.

Returning to FIG. 12, after building the Loop$^2$ conflict graph, the system identifies all Loop$^2$ violations, as indicated at block 1209. Loop$^2$ violations are identified by loops in the Loop$^2$ conflict graph. In order to reduce the solution set of Loop$^2$ violations, the system may waive decomposable Loop$^2$ violations, as indicated generally at block 1211, and as described in detail with reference to FIG. 17. Referring to FIG. 17, in processing according to some embodiments of the present disclosure, the system sets a constant Q equal to the number of Loop$^2$ combinations in the Loop$^2$ conflict graph, as indicated at block 1701, and sets q equal to 1, at block 1703. A Loop$^2$ combination is a set of connected loops in the Loop$^2$ conflict graph. The system then determines the number n of odd vertices in loop q, at block 1705. An odd vertex in a Loop$^2$ conflict graph corresponds to a loop of the conflict graph having an odd number of vertices. Then, the system determines, at decision block 1707, if n is less than two. If n is less than two, which indicates that layout corresponding to Loop$^2$ combination q is decomposable, the system removes combination q from the set of Loop$^2$ violations, at block 1709, and then determines, at decision block 1711, if q is equal to Q. If q is not equal to Q, the system increments q, at block 1713, and processing returns to block 1705. FIG. 17 processing thus continues all Loop$^2$ combinations have been check to see if they may be waived, whereupon processing returns to FIG. 12.

Returning to FIG. 12, after removing all decomposable Loop$^2$ combinations, the system displays any remaining Loop$^2$ violations on display 1103, as indicated at block 1213. A designer can then use the information displayed to modify the layout to eliminate triple-patterning violations. After correcting the identified violations, the designer can store the corrected layout in storage 1109, and run the process according to some embodiments of the present disclosure on the corrected layout to ensure that it is decomposable.

In some embodiments, a method of decomposing a layout for triple pattern lithography comprises: generating a first conflict graph from the layout; generating a second conflict graph from the first conflict graph; and, identifying loops in the second conflict graph as decomposition violations.

In some embodiments, generating the first conflict graph includes: assigning a first conflict graph vertex to each polygon in the layout; and connecting with first conflict graph edges all first conflict graph vertices assigned to polygons spaced less than a predetermined distance apart from each other.

In some embodiments, the method includes eliminating any crossing edges in the first conflict graph prior to generating the second conflict graph.

In some embodiments, the method includes removing from the first conflict graph any first conflict graph vertex having a degree of two or less prior to generating the second conflict graph.

In some embodiments, generating the second conflict graph includes: assigning a second conflict graph vertex to each loop in the first conflict graph; and, connecting with a second conflict graph edge each second conflict graph vertex to each adjacent second conflict graph vertex.

In some embodiments, the method includes removing from the second conflict graph all decomposable combinations of loops in the second conflict graph.

In some embodiments, the method as includes displaying identified loops in the second conflict graph.

In some embodiments, a system for decomposing a layout for triple pattern lithography comprises: a first conflict graph building unit that generates a first conflict graph from a stored layout; a second conflict graph building unit that generates a second conflict graph from the first conflict graph; and a violation identifying unit that identifies loops in the second conflict graph as decomposition violations.

In some embodiments, the first conflict graph building unit generates the first conflict graph by: assigning a first conflict graph vertex to each polygon in the layout; and connecting with first conflict graph edges all first conflict graph vertices assigned to polygons spaced less than a predetermined distance apart from each other.

In some embodiments, the system includes a cross-link eliminating unit that eliminates any crossing edges in the first conflict graph prior to generating the second conflict graph.

In some embodiments, the system includes a conflict graph eliminating unit that removes from the first conflict graph any first conflict graph vertex having a degree of two or less prior to generating the second conflict graph.

In some embodiments, the second conflict graph building unit generates the second conflict graph by assigning a second conflict graph vertex to each loop in the first conflict graph; and, connecting with a second conflict graph edge each second conflict graph vertex to each adjacent second conflict graph vertex.

In some embodiments, the system includes a decomposable combination waiving unit that removes from the second conflict graph all decomposable combinations of loops in the second conflict graph.

In some embodiments, the system includes a display that displays identified loops in the second conflict graph.

In some embodiments, a computer program product for decomposing a layout for triple pattern lithography comprises: instructions stored on machine readable storage media that, when executed by a computer, generate a first conflict graph from the layout; instructions stored on the machine readable storage media that, when executed by a computer, generate a second conflict graph from the first conflict graph; and, instructions stored on the machine readable storage media that, when executed by a computer, identify loops in the second conflict graph as decomposition violations.

In some embodiments, the instructions stored on machine readable storage media that, when executed by a computer, generate the first conflict graph include: instructions stored on the machine readable storage media that, when executed by a computer, assigning a first conflict graph vertex to each polygon in the layout; instructions stored on the machine readable storage media that, when executed by a computer, connect with first conflict graph edges all first conflict graph vertices assigned to polygons spaced less than a predetermined distance apart from each other.

In some embodiments, the computer program product includes instructions stored on the machine readable storage media that, when executed by a computer, eliminate any crossing edges in the first conflict graph prior to generating the second conflict graph.

In some embodiments, the computer program product includes instructions stored on the machine readable storage media that, when executed by a computer, remove from the first conflict graph any first conflict graph vertex having a degree of two or less prior to generating the second conflict graph.

In some embodiments, the instructions stored on the machine readable storage media that, when executed by a computer, generate the second conflict graph include instructions stored on the machine readable storage media that, when executed by a computer, assign a second conflict graph vertex to each loop in the first conflict graph; and, instructions stored on the machine readable storage media that, when executed by a computer, connect with a second conflict graph edge each second conflict graph vertex to each adjacent second conflict graph vertex.

In some embodiments, the computer program product includes instructions stored on the machine readable storage media that, when executed by a computer, remove from the second conflict graph all decomposable combinations of loops in the second conflict graph.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

The above-described embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

While preferred embodiments of the present subject matter have been described, it is to be understood that the embodiments described are illustrative only and that the appended claims shall be accorded a full range of equivalents, many variations and modifications naturally occurring to those of skill in the art from a perusal hereof

What is claimed is:

1. A method of decomposing a layout for triple pattern lithography, which comprises:
generating a first conflict graph from the layout;
generating, by the processor, a second conflict graph from the first conflict graph, wherein each vertex of the second conflict graph represents a loop in the first conflict graph; and,
identifying, by the processor, loops in the second conflict graph as triple patterning decomposition violations.

2. The method as claimed in claim 1, wherein generating the first conflict graph includes:
assigning, by the processor, a first conflict graph vertex to each polygon in the layout; and
connecting, by the processor, with first conflict graph edges all first conflict graph vertices assigned to polygons spaced less than a predetermined distance apart from each other.

3. The method as claimed in claim 2, including:
eliminating, by the processor, any crossing edges in the first conflict graph prior to generating the second conflict graph.

4. The method as claimed in claim 2, including:
removing, by the processor, from the first conflict graph any first conflict graph vertex having a degree of two or less prior to generating the second conflict graph.

5. The method as claimed in claim 2, wherein generating the second conflict graph includes:
assigning, by the processor, a second conflict graph vertex to each loop in the first conflict graph; and,
connecting, by the processor, with a second conflict graph edge each second conflict graph vertex to each adjacent second conflict graph vertex.

6. The method as claimed in claim 5, including:
removing, by the processor, from the second conflict graph all decomposable combinations of loops in the second conflict graph.

7. The method as claimed in claim 1, including displaying, by the processor, identified loops in the second conflict graph.

8. A system for decomposing a layout for triple pattern lithography, which comprises:
a first conflict graph building unit that generates a first conflict graph from a stored layout;
a second conflict graph building unit that generates a second conflict graph from the first conflict graph, wherein each vertex of the second conflict graph represents a loop in the first conflict graph; and,
a violation identifying unit that identifies loops in the second conflict graph as decomposition violations.

9. The system as claimed in claim 8, wherein the first conflict graph building unit generates the first conflict graph by:
assigning a first conflict graph vertex to each polygon in the layout;
connecting with first conflict graph edges all first conflict graph vertices assigned to polygons spaced less than a predetermined distance apart from each other.

10. The system as claimed in claim 9, including:
a cross-link eliminating unit that eliminates any crossing edges in the first conflict graph prior to generating the second conflict graph.

11. The system as claimed in claim 9, including:
a conflict graph eliminating unit that removes from the first conflict graph any first conflict graph vertex having a degree of two or less prior to generating the second conflict graph.

12. The system as claimed in claim 9, wherein the second conflict graph building unit generates the second conflict graph by:
assigning a second conflict graph vertex to each loop in the first conflict graph; and, connecting with a second conflict graph edge each second conflict graph vertex to each adjacent second conflict graph vertex.

13. The system as claimed in claim 12, including:
a decomposable combination waiving unit that removes from the second conflict graph all decomposable combinations of loops in the second conflict graph.

14. The system as claimed in claim 8, including a display that displays identified loops in the second conflict graph.

15. A computer program product for decomposing a layout for triple pattern lithography, which comprises:
instructions stored on non-transitory machine readable storage media that, when executed by a computer, generate a first conflict graph from the layout;
instructions stored on the non-transitory machine readable storage media that, when executed by a computer, generate a second conflict graph from the first conflict graph, wherein each vertex of the second conflict graph represents a loop in the first conflict graph; and,
instructions stored on the non-transitory machine readable storage media that, when executed by a computer, identify loops in the second conflict graph as decomposition violations.

16. The computer program product as claimed in claim 15, wherein the instructions stored on the non-transitory machine readable storage media that, when executed by a computer, generate the first conflict graph includes:
instructions stored on the non-transitory machine readable storage media that, when executed by a computer, assigning a first conflict graph vertex to each polygon in the layout;
instructions stored on the non-transitory machine readable storage media that, when executed by a computer, connect with first conflict graph edges all first conflict graph vertices assigned to polygons spaced less than a predetermined distance apart from each other.

17. The computer program product as claimed in claim 15, including:
instructions stored on the non-transitory machine readable storage media that, when executed by a computer, eliminate any crossing edges in the first conflict graph prior to generating the second conflict graph.

18. The computer program product as claimed in claim 15, including:
instructions stored on the non-transitory machine readable storage media that, when executed by a computer, remove from the first conflict graph any first conflict graph vertex having a degree of two or less prior to generating the second conflict graph.

19. The computer program product as claimed in claim 15, wherein the instructions stored on the non-transitory machine readable storage media that, when executed by a computer, generate the second conflict graph include:
instructions stored on the non-transitory machine readable storage media that, when executed by a computer, assign a second conflict graph vertex to each loop in the first conflict graph; and,
instructions stored on the non-transitory machine readable storage media that, when executed by a computer, connect with a second conflict graph edge each second conflict graph vertex to each adjacent second conflict graph vertex.

20. The computer program product as claimed in claim 19, including:
instructions stored on the non-transitory machine readable storage media that, when executed by a computer, remove from the second conflict graph all decomposable combinations of loops in the second conflict graph.

* * * * *